United States Patent [19]

Nishimura

[11] Patent Number: 5,705,935
[45] Date of Patent: Jan. 6, 1998

[54] METHOD OF MANAGING MAPPING DATA INDICATIVE OF EXCELLENT/DEFECTIVE CHIPS ON SEMICONDUCTOR WAFER

[75] Inventor: Katsuhiro Nishimura, Kumamoto, Japan

[73] Assignee: NEC Corporation, Tokyo, Japan

[21] Appl. No.: 505,623

[22] Filed: Jul. 21, 1995

[30] Foreign Application Priority Data

Jul. 22, 1994 [JP] Japan .................................. 6-170613

[51] Int. Cl.⁶ .................................................. G01R 31/02
[52] U.S. Cl. ........................................ 324/764; 324/158.1
[58] Field of Search ............................... 324/759, 764, 324/765, 158.1, 763

[56] References Cited

U.S. PATENT DOCUMENTS

| | | | |
|---|---|---|---|
| 3,847,284 | 11/1974 | Wiesler et al. | 324/759 |
| 4,928,002 | 5/1990 | Corley et al. | 235/479 |

FOREIGN PATENT DOCUMENTS

| | | |
|---|---|---|
| 5-190614 | 7/1993 | Japan . |
| 2 262 839 | 6/1993 | United Kingdom . |

*Primary Examiner*—Ernest F. Karlsen

[57] ABSTRACT

A mapping data indicative of locations of excellent integrated circuits is printed on a label sheet, and the label sheet carrying the mapping data is bonded to a peripheral area of a semiconductor wafer so as to easily manage the mapping data.

8 Claims, 5 Drawing Sheets

5,705,935

1

METHOD OF MANAGING MAPPING DATA INDICATIVE OF EXCELLENT/DEFECTIVE CHIPS ON SEMICONDUCTOR WAFER

FIELD OF THE INVENTION

This invention relates to a method of data management used in a fabrication process of a semiconductor device and, more particularly, to a method of managing mapping data indicative of excellent/defective chips on a semiconductor wafer.

DESCRIPTION OF THE RELATED ART

Narrow areas are defined in a surface of a semiconductor wafer, and are respectively assigned to integrated circuits. The integrated circuits are fabricated on the respective narrow areas through a complicated process sequence, and the semiconductor wafer is separated into the narrow areas upon completion of the fabrication process. The narrow areas are called as "semiconductor chips", and are respectively sealed in packages.

The integrated circuits are subjected to various tests before the separation into the semiconductor chips, and only excellent semiconductor chips are sealed in the packages. This procedure is important for a highly reliable products, and requires the manufacturer to exactly manage mapping data indicative of the locations of excellent/defective integrated circuits on the semiconductor wafer.

A typical data management uses a portable information recording medium such as a floppy disk. In detail, while a testing system is testing integrated circuits fabricated on narrow areas on a semiconductor wafer, the testing system diagnoses the integrated circuits, and stores the diagnosis indicative of whether the integrated circuit is excellent or defective in an internal memory.

Upon completion of the test, the testing system forms mapping data indicative of the locations of excellent integrated circuits and the locations of defective integrated circuits, and writes the mapping data into the portable information recording medium together with identity data information for identifying the semiconductor wafer.

An operator takes out the portable information recording medium, and brings it to a separation and assembling system. The separation and assembling system checks the mapping data, and selects the semiconductor chips of the excellent integrated circuits. The selected semiconductor chips are packaged, and delivered as excellent products.

However, the mapping data is stored in the recording medium physically separated from the semiconductor wafer, and the identity data is indispensable. The formation of the identity data and the portable recording medium make the prior art data management expensive.

Moreover, it is necessary to transfer the portable recording medium from the testing system to the separation and assembling system, and the operator is expected to surely provide the semiconductor wafer and the mapping data to the separation and assembling system. This transferring procedure makes the prior art data management complicated.

In order to make a data management simple and economical, the present inventor had proposed a repetition method of mapping data in Japanese Patent Application No. 4-3532, and was published in Japanese Patent Publication of Unexamined Application No. 5-190614 on Jul. 30, 1993.

FIG. 1 illustrates a semiconductor wafer 1 having a peripheral edge 1a. Scribe lines 1b extends on the semiconductor wafer 1 like a lattice, and define a plurality of narrow areas. Only four scribe lines are labeled with reference 2b in FIG. 1.

Integrated circuits are respectively assigned to the narrow rectangular areas without hatching lines, and are assumed to have been already fabricated in the narrow rectangular areas. The narrow rectangular areas without the hatching lines are arranged in matrix as shown. However, the narrow areas in the peripheral area of the semiconductor wafer 1 are not used for the integrated circuits, and are hatched in FIG. 1. The hatched narrow areas are covered with aluminum, and one of the hatched narrow areas 1c is used as a recording medium for storing mapping data.

Assuming now that the integrated circuits fabricated on the narrow rectangular areas are tested by the testing system (not shown), the testing system diagnoses the integrated circuits fabricated in the narrow rectangular areas marked with "X" to be defective. Though the testing system does not label the narrow rectangular areas with mark "X", the mark "X" is written into the narrow areas so as to clearly discriminate the defective integrated circuits from the excellent integrated circuits.

The testing system is equipped with a movable laser beam radiator, and radiates the laser beam to the aluminum film on the narrow hatched area 1c. The laser beam marks the location of the excellent integrated circuits, and skips a marking spot corresponding to the defective integrated circuit device. When the laser beam is radiated to a marking spot, the aluminum is evaporated, and a micro-recess is formed at the marking spot. However, when the marking spot is skipped, the aluminum film at the marking spot is maintained flat.

As a result, the micro-recesses 1d are selectively formed in the aluminum film as shown in FIG. 2. Finally, the testing system demagnified the periphery 1a of the semiconductor wafer 1, and the laser beam radiator draws a line indicative of the outline 1e of the semiconductor wafer 1 in the aluminum film. The relative relation between the periphery 1a and the narrow rectangular areas is similar to the relative relation between the outline 1e and the marking spots, and the marking spots and the outline 1e form the mapping data.

The mapping data is recorded in the aluminum film on the narrow area 1c of the semiconductor wafer 1, and are transferred to the separation/assembling system together with the semiconductor wafer 1. The narrow area 1c is not used for the integrated circuits, and an identity data is not required, because the narrow area 1c forms a part of the semiconductor wafer. For this reason, the data management is economical.

However, the prior art data management disclosed in the Japanese Patent Publication of Unexamined Application encounters a problem in that the marking operation with the laser beam deteriorates the production yield of the semiconductor integrated circuit devices.

If the semiconductor wafer is coated with resin such as polyimide, the separation/assembling system hardly reads the mapping data, and a malfunction takes place in the separation/assembling. This results in deterioration of the production yield.

SUMMARY OF THE INVENTION

It is therefore an important object of the present invention to provide a method of managing mapping data which is economical without deterioration of a production yield.

The present inventor contemplated the problem, and noticed that aluminum particles had damaged the integrated circuits.

To accomplish the object, the present invention proposes to adhere a label carrying mapping data on a narrow area on a semiconductor wafer.

In accordance with the present invention, there is provided a method of managing a mapping data indicative of locations of acceptable products and locations of defective products on a semiconductor wafer, comprising the steps of: testing products fabricated in first sub-areas defined in a major surface of the semiconductor wafer so as to determine acceptable products and defective products; writing first marks indicative of the first sub-areas of either acceptable or defective products and a second mark indicative of a reference for determining the first sub-areas on a label; and fixing the label on a second sub-area on the major surface of the semiconductor wafer where no product is fabricated.

BRIEF DESCRIPTION OF THE DRAWINGS

The features and advantages of the method of managing mapping data according to the present invention will be more clearly understood from the following description taken in conjunction with the accompanying drawings in which.

DESCRIPTION OF THE PREFERRED EMBODIMENTS

First Embodiment

Figure 1:
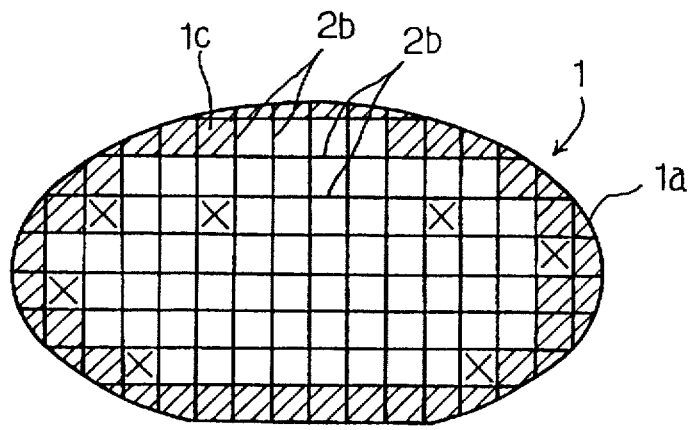
FIG. 1 is a perspective view showing the semiconductor wafer diagnosed by the testing system.
Figure 2:
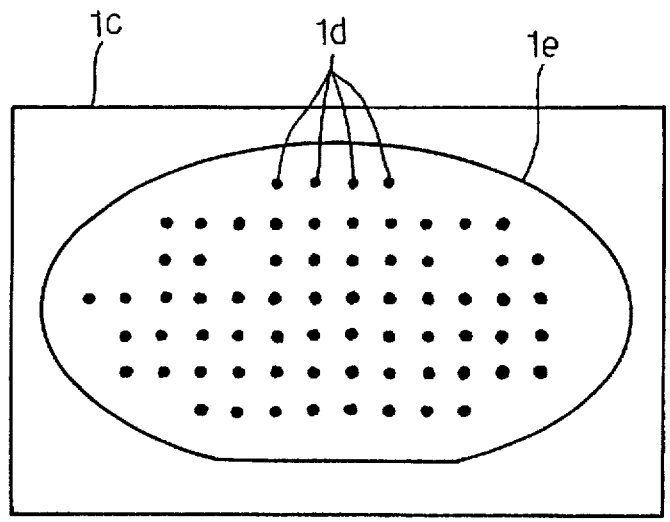
FIG. 2 is a plan view showing the prior art recording medium on the semiconductor wafer for storing the mapping data.
Figure 3:
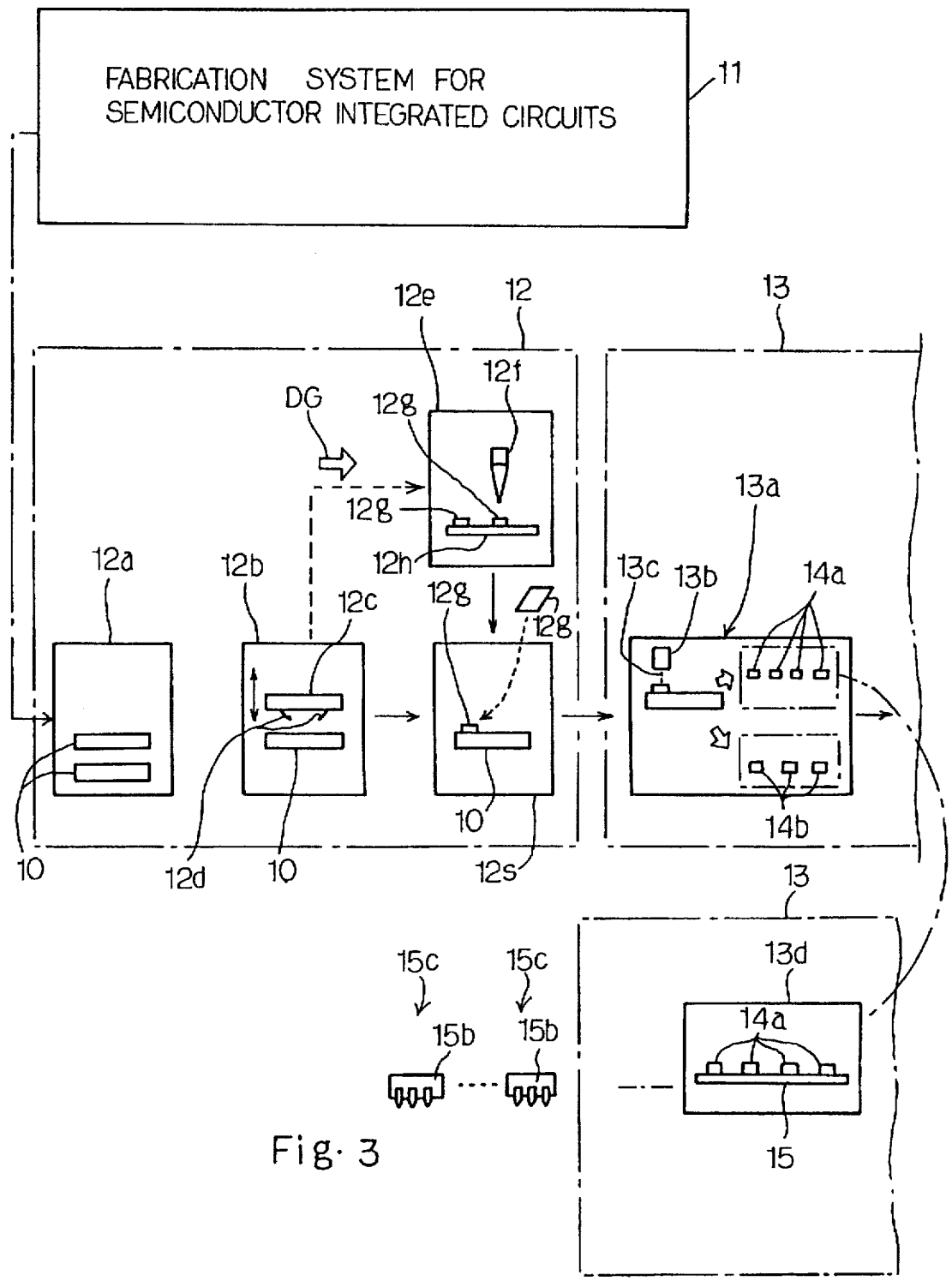
FIG. 3 is a schematic view showing a testing system used in a method of managing mapping data according to the present invention.

Referring to FIG. 3 of the drawings, a manufacturer fabricates integrated circuits on semiconductor wafers 10 through a fabrication system 11. The fabrication system 11 may include an oxidation sub-system, a lithographic subsystem, an ion implantation sub-system, a diffusion subsystem, a deposition sub-system and an etching sub-system.

The semiconductor wafers 10 are conveyed to a testing system 12, and the testing system 12 diagnoses the integrated circuits fabricated on the semiconductor wafer 10.

The testing system 12 includes a loading apparatus 12a and a prober 12b. The loading apparatus 12a sequentially supplies the semiconductor wafers 10 to the prober 12b. The prober 12b is equipped with a probe card 12c, and the prober 12b supplies test patterns through probes 12d provided on the probe card 12c to the integrated circuits on the wafer 10.

Each of the integrated circuits is responsive to the test patterns, and produces output signals. The output signals are transferred through the probes 12d to the prober 12b, and the prober 12 compares actual values indicated by the output signals with expected values. The prober 12b diagnoses the integrated circuits to be whether excellent or defective through the comparison, and generates diagnosis data DG indicative of the diagnosis and the location of the examined integrated circuit. The prober 12b supplies the diagnosis data DG to a marking apparatus 12e.

A dot printer is incorporated in the marking apparatus 12e, and is equipped with a printer head 12f. Aluminum labels 12g are bonded to a tape 12h, and are peelable from the tape 12h. The tape 12h successively conveys the aluminum labels 12g beneath the printer head 12f, and the printer head 12f writes mapping data for each semiconductor wafer 10 on the label 12g.

Figure 4:
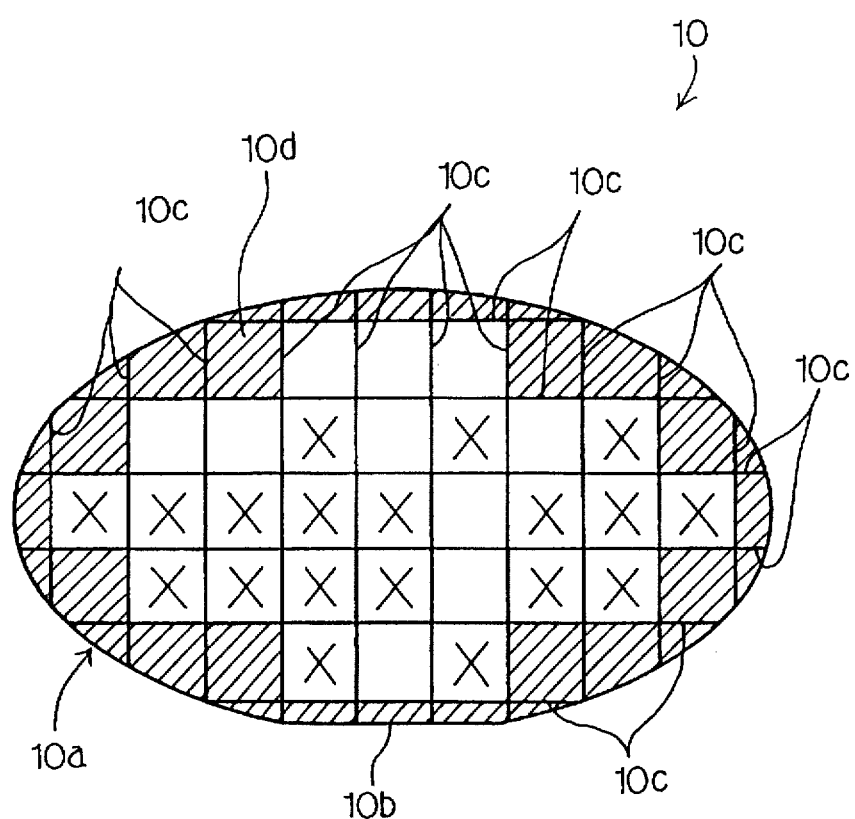
FIG. 4 is a perspective view showing a semiconductor wafer where scribe lines define narrow areas assigned to integrated circuits.

One of the semiconductor wafer 10 is illustrated in FIG. 4. The semiconductor wafer 10 is obliquely seen, and, for this reason, the periphery 10a of the semiconductor wafer 10 is represented by an ellipse. The periphery 10a contains an orientation flat 10b. Scribe lines 10a are formed on the semiconductor wafer 10 like a lattice.

The scribe lines 10c partitions a major surface of the semiconductor wafer 10 into a plurality of narrow areas 10b and 10c, and the narrow areas without hatch lines are used for the integrated circuits. These narrow areas serve as first areas. The other areas are not used for an integrated circuit, and are hatched. The hatched narrow areas are covered with aluminum, and one 10d of the hatched narrow areas serves as a second area.

The testing system is assumed to diagnose several integrated circuits to be defective, and the narrow areas assigned the defective integrated circuits are marked with "X" in FIG. 4. Note the mark "X" is not actually written in the narrow areas by the testing system.

The integrated circuits assigned the narrow areas without mark "X" are excellent. The diagnosis data DG contains a piece of reference information indicative of the periphery 10a and pieces of locational information indicative of the narrow areas assigned the excellent integrated circuits. In another implementation, the diagnosis data may contain the piece of reference information and pieces of locational information indicative of the narrow areas assigned the defective integrated circuits.

Figure 5:
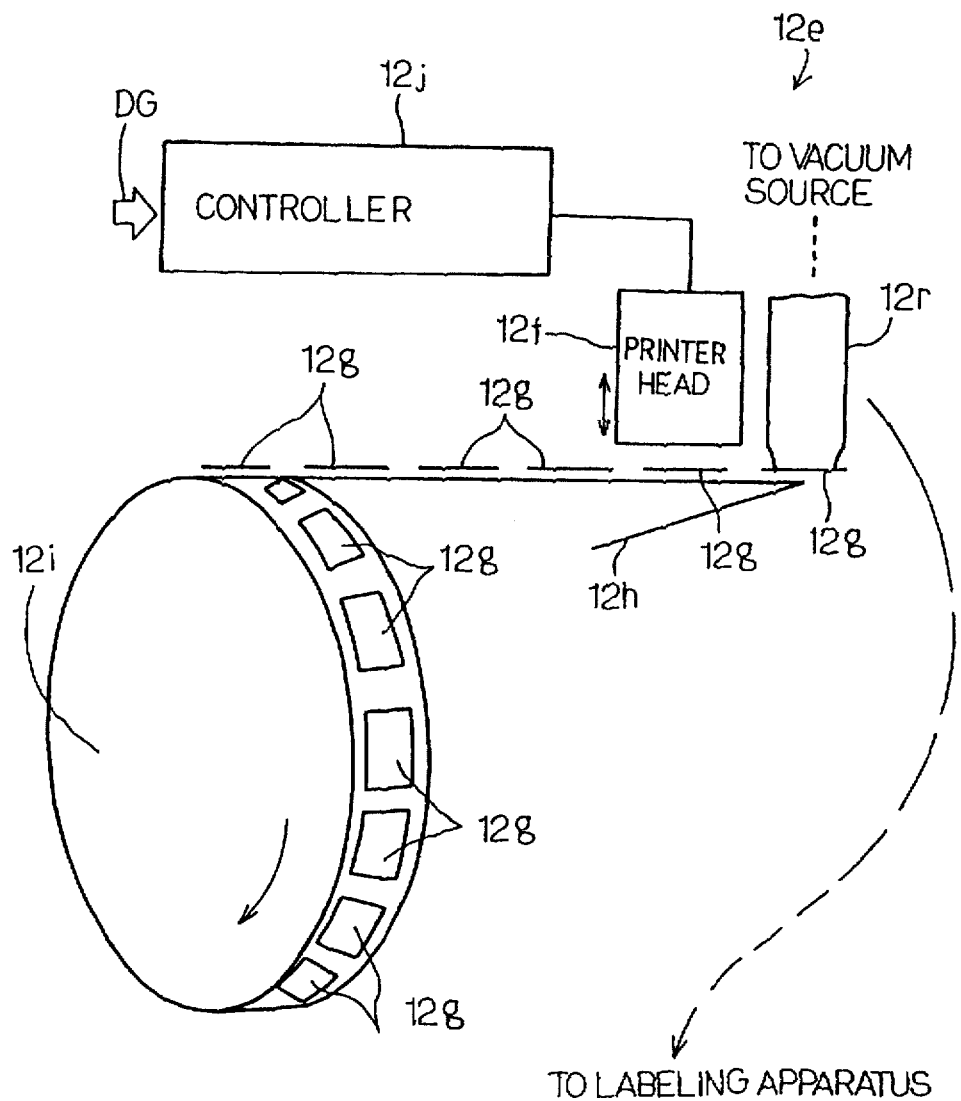
FIG. 5 is a schematic view showing a marking apparatus used in the method of managing the mapping data.

FIG. 5 illustrates essential parts of the dot printer incorporated in the marking apparatus 12e. The tape carrying the labels 12g is wound on a rotating drum 12i. The drum 12i is intermittently rotated, and the tape 12h is wound off from the drum 12i. The tape 12h carries the label 12g beneath the printer head 12f, and a controller 12j drives the printer head 12f so as to form a dot pattern 12k and a dot line 12m on the label 12g in response to the diagnosis data DG. The dot pattern 12k and the dot line 12m are representative of the piece of reference information and the pieces of locational information, and form the mapping data.

Figure 6:
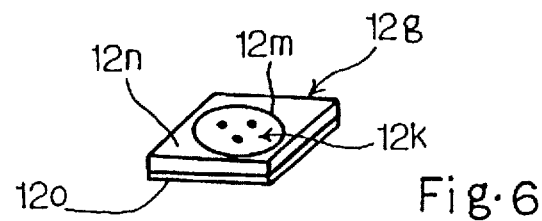
FIG. 6 is a perspective view showing a label carrying the mapping data.
Figure 7:
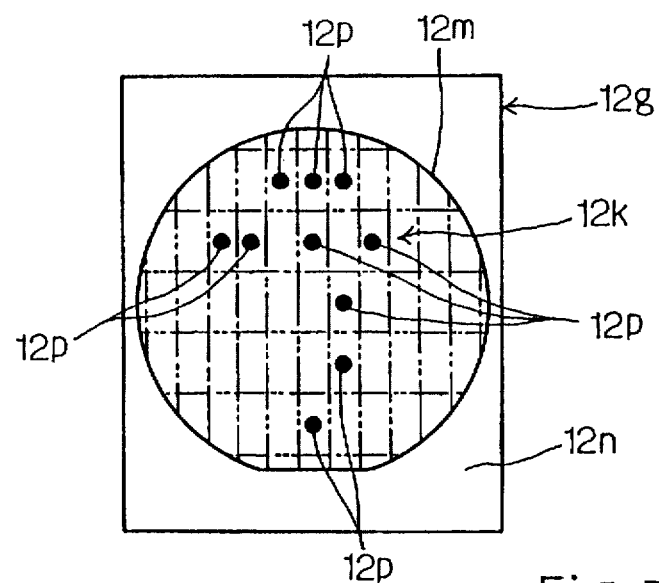
FIG. 7 is a plan view showing the label carrying the mapping data.

FIGS. 6 and 7 illustrate the label 12g carrying the mapping data. The label 12g is implemented by an aluminum sheet 12n and an adhesive compound layer 12o. The printer head 12f writes the dot pattern 12k and the dot line 12m on the aluminum sheet 12n in a predetermined color. The predetermined color is discriminative through a laser beam radiation by a discriminator described hereinlater. The adhesive compound is moisture resistant adhesive resin compound, and is coated on the back surface of the aluminum sheet 12n. Although the adhesive compound layer maintains the aluminum sheet 12n on the tape 12h, it easily peels off from the tape 12h, and is left on the back surface of the aluminum sheet 12n.

Figure 8:
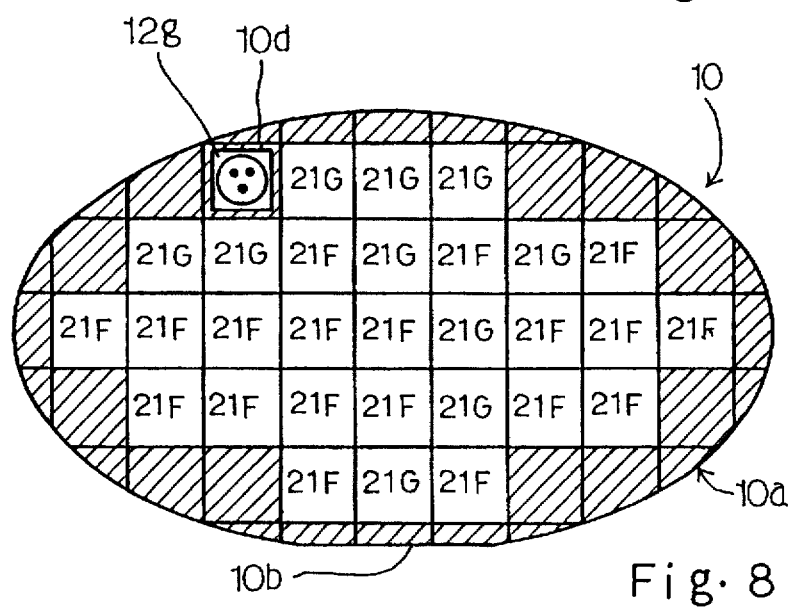
FIG. 8 is a perspective view showing the label bonded to the semiconductor wafer.

If the dot pattern 12k is formed by ten dots 12p, the dots 12p are indicative of the excellent integrated circuits formed in the narrow areas 21G on the semiconductor wafer 10 (see FIG. 8), and the integrated circuits in the areas 21F are diagnosed to be defective. The relative relation between the dot line 12m and each dot 12p is corresponding to the relation between the periphery 10a and each narrow area 21G/21F, and a separating/selecting apparatus 13a (see FIG. 3) easily selects the excellent integrated circuits from the defective integrated circuits on the basis of the mapping data. Although dots-and-dash lines are drawn like a lattice in FIG. 7, they imaginarily indicate the scribe lines 10c on the semiconductor wafer 10, and are not actually written on the aluminum sheet 12n.

Turning back to FIG. 5, the label 12g carrying the mapping data is moved to a vacuum pincette 12r or an absorbing head. The vacuum pincette 12r separates the label 12g from the tape 12h, and brings the label 12g to the labeling apparatus 12s (see FIG. 3). The vacuum pincette 12r is aligned with the narrow area 10d, and presses the label 12g against the aluminum film in the narrow area 10d. The vacuum is broken, and the vacuum pincette 12r leaves the label 12g. The vacuum pincette 12r returns to the home position in the marking apparatus 12e.

The semiconductor wafer 10 thus labeled with the marked label 12g is transferred to an assembling system 13. The semiconductor wafer 10 labeled with the marked label 12g is loaded into the separating/selecting apparatus 13a, and the separating/selecting apparatus 13a is equipped with a laser beam reader 13b.

The laser beam reader 13b radiates a laser beam 13c onto the marked label 12g, and measures the intensity of the reflection. The laser beam 13c is swept over the surface of the marked label 12g. While the laser beam 12c is moving on the aluminum, the intensity is strong. However, when the laser beam 13c is incident onto the dot 12p or the dot line 12m, the intensity of the reflection becomes weak. The variation of the intensity is stored in a memory of a controller (not shown), and determines the relative position of the dots 12p.

A separator (not shown) breaks the semicondcutor wafer 10 along the scribe lines 10c, and separates it into a plurality of semiconductor chips corresponding to the narrow areas. The excellent semiconductor chips 14a and the defective semiconductor chips 14b are grouped as shown.

The excellent semiconductor chips 14a are transferred to a bonding apparatus 13d, and a collet (not shown) sequentially supplies the excellent semiconductor chips 14a to lead frames 15a. The excellent semiconductor chips 14a are bonded to the lead frames 15a, and the excellent semiconductor chips 14a mounded on the lead frames 15a are sealed in suitable packages 15b. Thus, the semiconductor integrated circuit devices 15c are fabricated.

As will be appreciated from the foregoing description, the mapping data is written into the label 12g, and, thereafter, the label 12g is bonded to a narrow area not used for the integrated circuit. Therefore, the write-in operation never affects the integrated circuits fabricated on the semiconductor wafer, and the production yield is enhanced.

Moreover, even if the semiconductor wafer is coated with a resin film, the label 12g is bonded to the resin film over the predetermined area, and the laser beam reader 13b can clearly discriminate the mapping data.

In this instance, the dots 12p and the dot line 12m are marked on the aluminum sheet 12n in a single color. However, if the testing apparatus grades the integrated circuits, the marking apparatus 12e forms dots in different colors depending upon the grades of the integrated circuits. The dots different in colors result in different intensities of the reflection, and the separating/selecting apparatus 13a groups the integrated circuits into more than two grades.

Although particular embodiments of the present invention have been shown and described, it will be obvious to those skilled in the art that various changes and modifications may be made without departing from the spirit and scope of the present invention.

For example, the data managing method according to the present invention is applicable to any kind of semiconductor device such as a semiconductor discrete device and a semiconductor photo-device.

What is claimed is:

1. A method of managing a mapping data indicative of locations of acceptable products and locations of defective products on a semiconductor wafer, comprising the steps of:

a) testing products fabricated in first sub-areas defined in a major surface of said semiconductor wafer so as to determine acceptable products and defective products;

b) writing first marks indicative of said first sub-areas of either acceptable or defective products and a second mark indicative of a reference for determining said first sub-areas on a label separated from said semiconductor wafer; and c) fixing said label to a second sub-area on said major surface of said semiconductor wafer where on product is fabricated.

2. The method as set forth in claim 1, in which said second mark is a line representing a periphery of said semiconductor wafer, and said first marks are dots formed inside of said line, a relative relation between said line and each of said dots being corresponding to a relative relation between said periphery of said semiconductor wafer and one of said first sub-areas assigned said either acceptable or defective product.

3. The method as set forth in claim 2, in which said line and said dots reflects a light beam at a first intensity different from a second intensity of said light beam reflected on a surface of said label.

4. The method as set forth in claim 2, in which said dots are marked in one of a plurality of colors, said plurality of colors being representing grades of said acceptable products, respectively.

5. The method as set forth in claim 1, in which said label includes an aluminum sheet having a first surface where said first marks and said second mark are written, and an adhesive compound layer laminated on a second surface of said aluminum sheet different from said first surface.

6. The method as set forth in claim 5, in which said adhesive compound layer is adhered onto said second sub-area.

7. The method as set forth in claim 1, further comprising the steps of d) reading said first marks and said second mark from said label, e) determining said first sub-areas assigned said either acceptable or defective products, and f) separating said first sub-areas assigned to acceptable products from said first sub-areas assigned to said defective products.

8. The method as set forth in claim 7, in which said second mark and said first marks are a line representing a periphery of said semiconductor wafer and dots formed inside of said line, respectively, arranged in such a manner that a relative relation between said line and each of said dots is corresponding to a relative relation between said periphery of said semiconductor wafer and one of said first sub-areas assigned said either acceptable or defective product, said line and said dots reflecting a light beam at a first intensity different from a second intensity of said light beam reflected on a surface of said label, said step d) includes the sub-steps of d-1) sweeping said label with said light beam so as to measure said first intensity and said second intensity, d-2) discriminating said relative relation between said line and said each of said dots, and d-3) determining said relation between said periphery and said first sub-areas corresponding to said dots.

* * * * *